United States Patent
Subramanian et al.

(10) Patent No.: US 11,522,525 B2
(45) Date of Patent: Dec. 6, 2022

(54) RECONFIGURABLE GALLIUM NITRIDE (GAN) ROTATING COEFFICIENTS FIR FILTER FOR CO-SITE INTERFERENCE MITIGATION

(71) Applicant: RAYTHEON COMPANY, Waltham, MA (US)

(72) Inventors: Ajay Subramanian, Nashua, NH (US); Zhaoyang C. Wang, Carlisle, MA (US); Matthew A. Morton, Reading, MA (US); Jack Holloway, Arlington, VA (US); John Cangeme, Hollis, NH (US)

(73) Assignee: RAYTHEON COMPANY, Waltham, MA (US)

( * ) Notice: Subject to any disclaimer, the term of this patent is extended or adjusted under 35 U.S.C. 154(b) by 287 days.

(21) Appl. No.: 16/885,973

(22) Filed: May 28, 2020

(65) Prior Publication Data
US 2021/0376818 A1     Dec. 2, 2021

(51) Int. Cl.
*H03H 17/02*     (2006.01)
*H03H 11/26*     (2006.01)
(Continued)

(52) U.S. Cl.
CPC ...... *H03H 17/0219* (2013.01); *H03H 11/265* (2013.01); *H03H 15/00* (2013.01); *H03H 17/0248* (2013.01); *H03H 17/0294* (2013.01); *H03H 17/08* (2013.01); *H03H 2015/007* (2013.01); *H03H 2017/0081* (2013.01); *H04B 1/525* (2013.01)

(58) Field of Classification Search
CPC .......... H03H 17/0219; H03H 17/0248; H03H 11/265; H03H 15/00; H03H 17/08; H03H 17/0294
See application file for complete search history.

(56) References Cited

U.S. PATENT DOCUMENTS 5,204,827 A     4/1993     Fujita et al.
5,563,819 A     10/1996     Nelson
(Continued)

OTHER PUBLICATIONS

Chung, S. et al. "Digital Post-Correction on Dynamic Nonlinearity in GaN HEMT Track-and-Hold Sampling Circuits," IEEE Compound Semiconductor Integrated Circuit Symposium (CSICS), 2017, pp. 1-4.

(Continued)

*Primary Examiner* — Khai M Nguyen
(74) *Attorney, Agent, or Firm* — Lando & Anastasi, LLP

(57) ABSTRACT

A finite impulse response (FIR) filter including an input of the FIR filter that receives an RF input signal, a clock input configured to receive a clock signal, an output of the FIR filter that provides a filtered output signal, a plurality of signal paths including a plurality of sample-and-hold circuits and a plurality of multipliers arranged in parallel, each signal path including a respective sample-and-hold circuit and a respective multiplier being configured to receive the RF input signal and the clock signal to provide a modulated output signal, an adder configured to receive n modulated output signals from the plurality of signal paths and combine the n modulated output signals to produce the filtered output signal, and a controller.

21 Claims, 13 Drawing Sheets

(51) Int. Cl.
    *H03H 15/00*     (2006.01)
    *H03H 17/08*     (2006.01)
    *H03H 17/00*     (2006.01)
    *H04B 1/525*     (2015.01)

(56) References Cited

U.S. PATENT DOCUMENTS

| | | | |
|---|---|---|---|
| 6,032,171 | A | 2/2000 | Kiriaki et al. |
| 6,529,926 | B1 | 3/2003 | Capofreddi |
| 9,923,549 | B2* | 3/2018 | Kultran .................. H03H 15/00 |
| 10,193,532 | B2* | 1/2019 | Choi ........................ G06F 17/10 |
| 2005/0094722 | A1 | 5/2005 | Takatori et al. |
| 2010/0271107 | A1 | 10/2010 | Tran et al. |
| 2015/0078226 | A1 | 3/2015 | Charlon et al. |
| 2015/0099478 | A1 | 4/2015 | Wyville |
| 2015/0146589 | A1 | 5/2015 | Webb et al. |
| 2019/0013821 | A1 | 1/2019 | Kappes et al. |
| 2019/0097624 | A1* | 3/2019 | Nagi .................. H01L 29/2003 |

OTHER PUBLICATIONS

Sewter et al., "A 3-Tap FIR Filter With Cascaded Distributed Tap Amplifiers for Equalization Up to 40 GB/s in 0.18-μm CMOS" IEEE Journal of Solid-State Circuits, (2006), vol. 41, No. 8, pp. 1919-1929.

Park et al., "A 3.25 GS/s 4-Tap Analog FIR Filter Design with Coefficient Control using 6-bit Split-Capacitor DAC as a Tunable Coefficient Multiplier," IEEE (2016).

Park et al., "A Low-Power 3.25GS/s 4th-Order Programmable Analog FIR Filter Using Split-CDAC Coefficient Multipliers for Wideband Analog Signal Processing," IEEE (2018).

\* cited by examiner

RECONFIGURABLE GALLIUM NITRIDE (GAN) ROTATING COEFFICIENTS FIR FILTER FOR CO-SITE INTERFERENCE MITIGATION

BACKGROUND

1. Field of Invention

Embodiments of the invention relate generally to signal processing systems, and more specifically, to finite impulse response (FIR) filters.

2. Discussion of Related Art

As is known in the art, FIR filters have been used to implement various frequency responses using analog and/or digital components. The filter structure typically includes a series of delays, multipliers, and adders to generate the filter output. FIR filters are often configured to function as low-pass, high-pass, or band pass filters. In some cases, FIR filters can be configured to synthesize specific frequency responses, such as signal channels or paths. As such, it can be desirable to utilize FIR filters for signal conditioning in radar systems. However, such radar systems are often configured to operate at high frequencies with high signal power, limiting the types of components and structures that can be used to implement FIR filters.

SUMMARY

One aspect of the present disclosure is directed to a finite impulse response (FIR) filter including an input of the FIR filter that receives an RF input signal, a clock input configured to receive a clock signal, an output of the FIR filter that provides a filtered output signal, a plurality of signal paths including a plurality of sample-and-hold circuits and a plurality of multipliers arranged in parallel, each signal path including a respective sample-and-hold circuit and a respective multiplier being configured to receive the RF input signal and the clock signal to provide a modulated output signal, an adder configured to receive n modulated output signals from the plurality of signal paths and combine the n modulated output signals to produce the filtered output signal, and a controller.

In one embodiment, the FIR filter includes a plurality of switches, each switch of the plurality of switches being coupled to the controller and configured to selectively connect and disconnect at least one signal path of the plurality of signal paths. In some embodiments, the controller and the plurality of switches are configured to be controllable and to be operated to adjust a value of n. In certain embodiments, each signal path of the plurality of signal paths includes a path delay, and a total delay of the filtered output signal relative to the RF input signal is controlled by adjusting the value of n.

In some embodiments, the plurality of sample-and-hold circuits are configured to receive a plurality of delayed clock signals, each delayed clock signal of the plurality of delayed clock signals being the clock signal delayed by a different amount. In various embodiments, the plurality of sample-and-hold circuits are further configured to sample the RF input signal based on the plurality of delayed clock signals to provide a plurality of sampled output signals.

In one embodiment, the plurality of multipliers are configured to receive a respective tap coefficient signal and to multiply the sampled output signals with a respective tap coefficient value of the tap coefficient signal to provide a plurality of modulated output signals. In some embodiments, the tap coefficient signals correspond to settings for an n-tap filter configuration. In certain embodiments, each tap coefficient signal includes at least one rotating tap coefficient value.

In various embodiments, the plurality of sample-and-hold circuits and the plurality of multipliers include one or more Gallium Nitride (GaN) devices configured to provide linear operation of the FIR filter. In some embodiments, the controller provides a supply voltage to the one or more GaN devices that is adjusted based on a maximum voltage of the RF input signal to optimize at least one of power consumption and spurious performance. In certain embodiments, the supply voltage is adjusted to a minimum value needed to support a maximum voltage swing of the RF input signal.

In one embodiment, each sample-and-hold circuit of the plurality of sample-and-hold circuits includes a plurality of GaN HEMTs arranged in a gate-bootstrapping stage and a sample-and-hold stage. In some embodiments, the sample-and-hold stage includes a source follower and a switched current source configured to charge and/or discharge a capacitor to track a voltage of the input signal during a tracking period and to hold the capacitor charge during a holding period. In certain embodiments, the gate-bootstrapping stage is coupled to the source follower of the sample-and-hold stage to prevent large voltage swings of the input signal from allowing the capacitor to be charged and/or discharged during the holding period.

Another aspect of the present disclosure is directed to an analog cancellation module including a finite impulse response (FIR) filter for use in a transceiver system. The analog cancellation module includes an input of the analog cancellation module that receives an RF input signal, the RF input signal corresponding to a transmit signal provided to a transmit path of the transceiver system, an output of the analog cancellation module that provides a cancellation signal to a receive path of the transceiver system to cancel transmit signal interference, the FIR filter including a plurality of signal paths configured to provide a synthesized frequency response corresponding to the receive path and an adder, each signal path including a respective sample-and-hold circuit and a respective multiplier configured to receive the RF input signal and provide a modulated output signal, the adder being configured to receive n modulated output signals from the plurality of signal paths and combine the n modulated output signals to provide the cancellation signal, and a controller.

In one embodiment, each sample-and-hold circuit and multiplier of the FIR filter includes one or more Gallium Nitride (GaN) devices configured to provide linear operation of the FIR filter. In some embodiments, the FIR filter further includes a plurality of switches coupled to the controller and configured to selectively connect and disconnect at least one signal path of the plurality of signal paths. In certain embodiments, the controller and the plurality of switches of the FIR filter are configured to be controllable and to be operated to adjust a value of n. In various embodiments, the value of n corresponds to a number of taps of the FIR filter and is adjusted to control a delay of the cancellation signal relative to the transmit signal interference.

In some embodiments, each multiplier is configured to receive rotating tap coefficients corresponding to n-tap filter settings and to multiply an output signal of each sample-and-hold circuit with the rotating tap coefficients to provide the n modulated output signals. In one embodiment, the n-tap filter settings correspond to a frequency response of the receive path of the transceiver system.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

As discussed above, FIR filters can be used to synthesize various frequency responses, such as signal channels, and it may be desirable to utilize FIR filters for signal conditioning in radar systems. However, such radar systems are often designed to operate at high frequencies with high signal power. As such, the types of components and structures that can be used to implement FIR filters in such systems can be limited. For example, digital FIR filter implementations include analog-to-digital conversion stages which can be expensive and difficult to implement with high powered signals at high radio-frequencies. Likewise, analog FIR filter implementations often include semiconductor devices that have limited operational ranges (e.g., frequency, power, etc.) for providing acceptable performance.

An improved analog FIR filter implementation is provided herein. In at least one embodiment, the FIR filter structure includes Gallium Nitride (GaN) components configured to provide high linearity operation for high powered signals. In one example, the FIR filter is configured to synthesize the frequency response of a front-end receiver and included in a radar transceiver system to mitigate co-site transmit interference.

Figure 1:
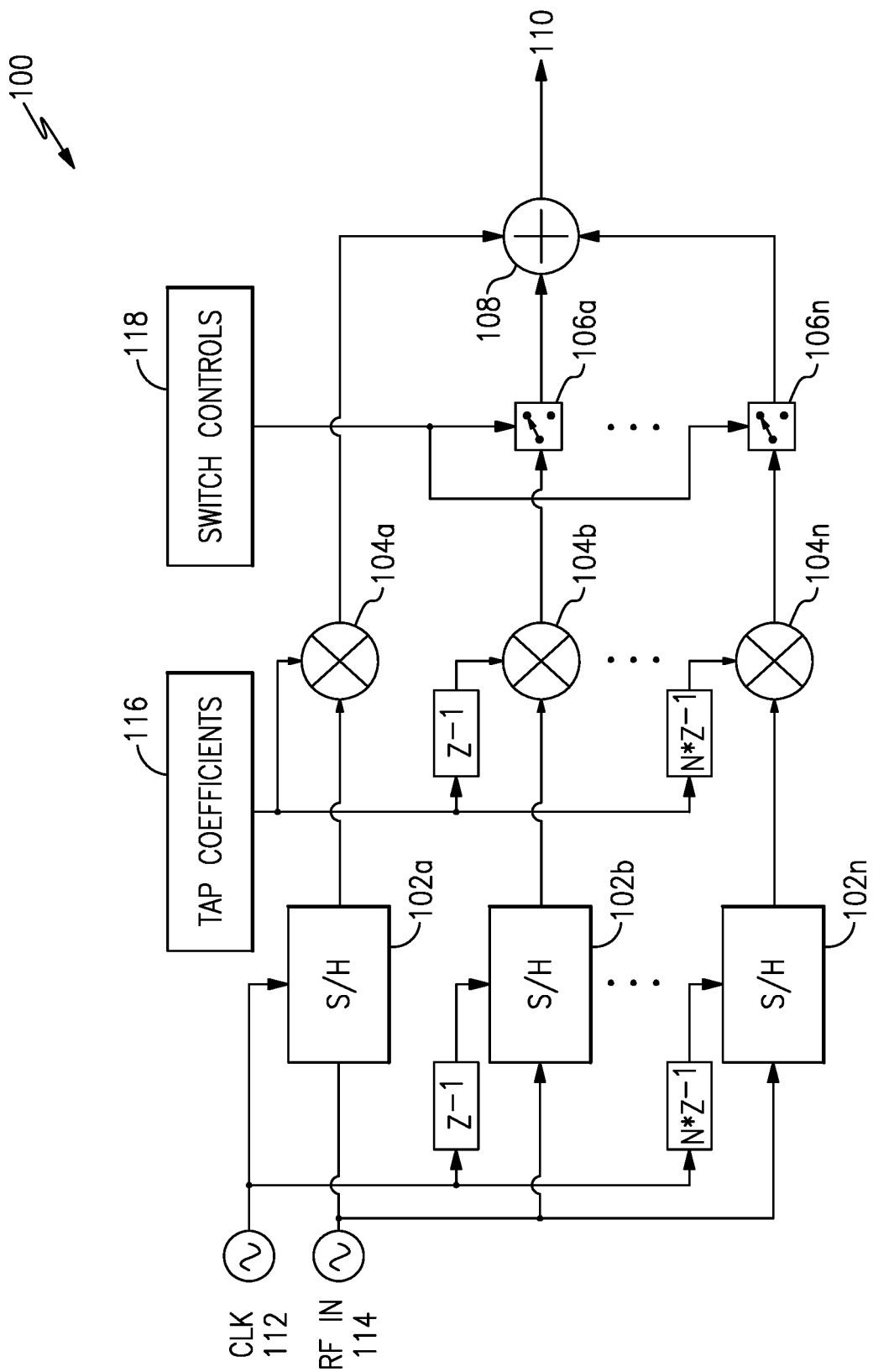
FIG. 1 is a functional block diagram of a FIR filter in accordance with aspects described herein.

FIG. 1 illustrates a functional block diagram of a FIR filter 100 in accordance with aspects described herein. In one example, the FIR filter 100 includes a plurality of sample-and-hold (S/H) circuits 102, a plurality of multipliers 104, a plurality of switches 106, and an adder 108. In some examples, the sample-and-hold circuits may be alternatively referred to as track-and-hold (T/H) circuits. In certain examples, the FIR filter 100 may include a tap coefficient source 116 and a switch control source 118.

As shown, the plurality of sample-and-hold circuits 102 and the plurality of multipliers 104 are arranged in n parallel signal paths. For example, a first path includes a first sample-and-hold circuit 102a and a first multiplier 104a, a second path includes a second sample-and-hold circuit 102b and a second multiplier 104b, and so on. In one example, the output of each path is connected to the adder 108. In some examples, the plurality of switches 106 includes n-1 switches that can be operated to selectively disable individual paths (e.g., decouple the path output from the adder 108). For example, the second path includes a first switch 106a coupled between the second multiplier 104b and the adder 108.

In one example, a clock signal 112 is provided to each sample-and-hold circuit of the plurality of sample-and-hold circuits 102. In some examples, the clock signal is provided to each sample-and-hold circuit with a different delay. For example, the first sample-and-hold circuit 102a may receive the clock signal with no delay, the second sample-and-hold circuit 102b may receive the clock signal with a delay corresponding to $z^{-1}$, and the $n^{th}$ sample-and-hold circuit 102n may receive the clock signal with a delay corresponding to $n*z^{-1}$. Likewise, an input signal 114 is provided to each sample-and-hold circuit of the plurality of sample-and-hold circuits 102.

Figure 2A:
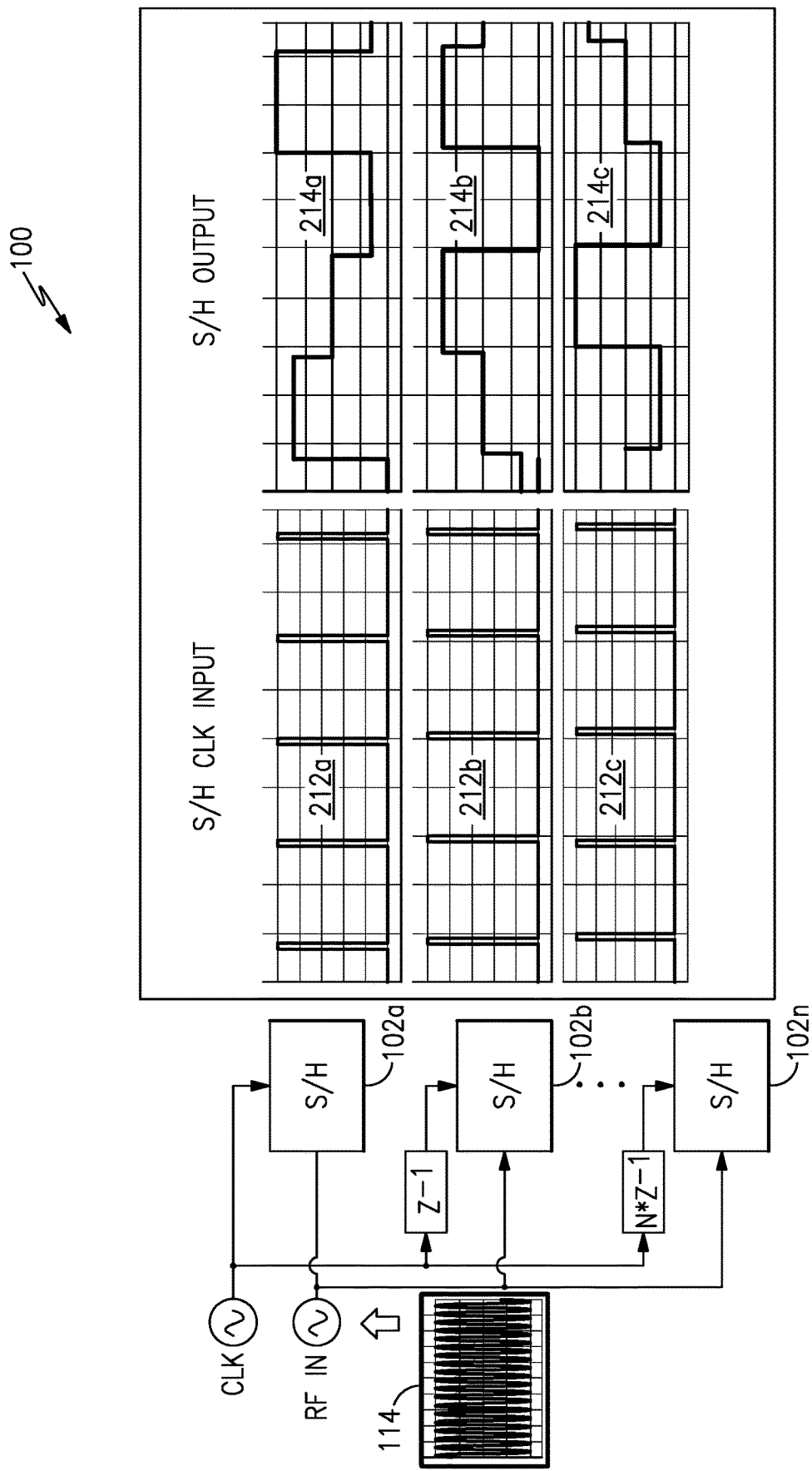
FIG. 2A is a diagram illustrating operation of the FIR filter of FIG. 1 in accordance with aspects described herein.

As shown in FIG. 2A, the input signal 114 may be a radio-frequency signal having an input frequency (e.g., 2.5 GHz). In some examples, the input signal 114 is distributed such that each sample-and-hold circuit receives the input signal 114 at substantially the same time (i.e., synchronously). As described above, the clock signal 112 is distributed to the sample-and-hold circuits with various delays. In one example, the clock signal 212a received by the first sample-and-hold circuit 102 corresponds to the clock signal 112. Likewise, the clock signal 212b received by the second sample-and-hold circuit 102b corresponds to the clock signal 112 delayed by a first amount (e.g., $z^{-1}$), the clock signal 212c received by a third sample-and-hold circuit 102c corresponds to the clock signal 112 delayed by a second amount (e.g., $2*z^{-1}$), and so on.

As such, each sample-and-hold circuit of the plurality of sample-and-hold circuits 102 may sample the input signal 114 at different times (i.e., asynchronously). In some examples, the clock signal delays can be staggered such that only one sample-and-hold circuit samples the input signal 114 at a time. In one example, each sample-and-hold circuit is configured to sample the input signal 114 based on the received clock signal and to hold the sampled value until the next sample.

Each sample-and-hold circuit may sample the input signal 114 when the received clock signal is driven high (e.g., 1); however, in other examples each sample-and-hold circuit may sample the input signal 114 when the received clock signal driven is low (e.g., 0). As shown in FIG. 2A, the signal 214a corresponds to the output of the first sample-and-hold circuit 102a, the signal 214b corresponds to the output of the second sample-and-hold circuit 102b, and the signal 214c corresponds to the output of the third sample-and-hold circuit 102c. In one example, the output of each sample-and-hold circuit of the plurality of sample-and-hold circuits 102 can be referred to as a "tap".

In some examples, the clock signal 112 can have a clock frequency (e.g., 0.3-1.5 GHz) lower than the input signal frequency (e.g., 2.5 GHz). By sampling the input signal in parallel with the plurality of sample-and-hold circuits 102, the input signal is effectively sampled at a much higher frequency (e.g., 10 GHz).

Returning to FIG. 1, the output of each sample-and-hold circuit (i.e., tap) is connected to a corresponding multiplier of the plurality of multipliers 104. For example, the output of the sample-and-hold circuit 102a of the first signal path is connected to the multiplier 104a, the output of the sample-and-hold circuit 102b of the second signal path is connected to the multiplier 104b, and so on. In one example, each multiplier of the plurality of multipliers 104 is connected to the tap coefficient source 116. The tap coefficient source 116 may provide coefficient values and/or signals to each multiplier corresponding to a desired frequency response of the FIR filter 100 (e.g., low-pass, band-pass, etc.). In one example, the tap coefficients provided to the plurality of multipliers 104 correspond to the impulse response of the desired frequency response.

In some examples, the tap coefficient source 116 is configured to rotate the coefficients provided to each multiplier. For example, the tap coefficient source 116 may provide a tap coefficient signal to each multiplier having an amplitude and frequency that dictate various characteristics of the FIR filter 100 (e.g., bandwidth, ripple, etc.).

Figure 2B:
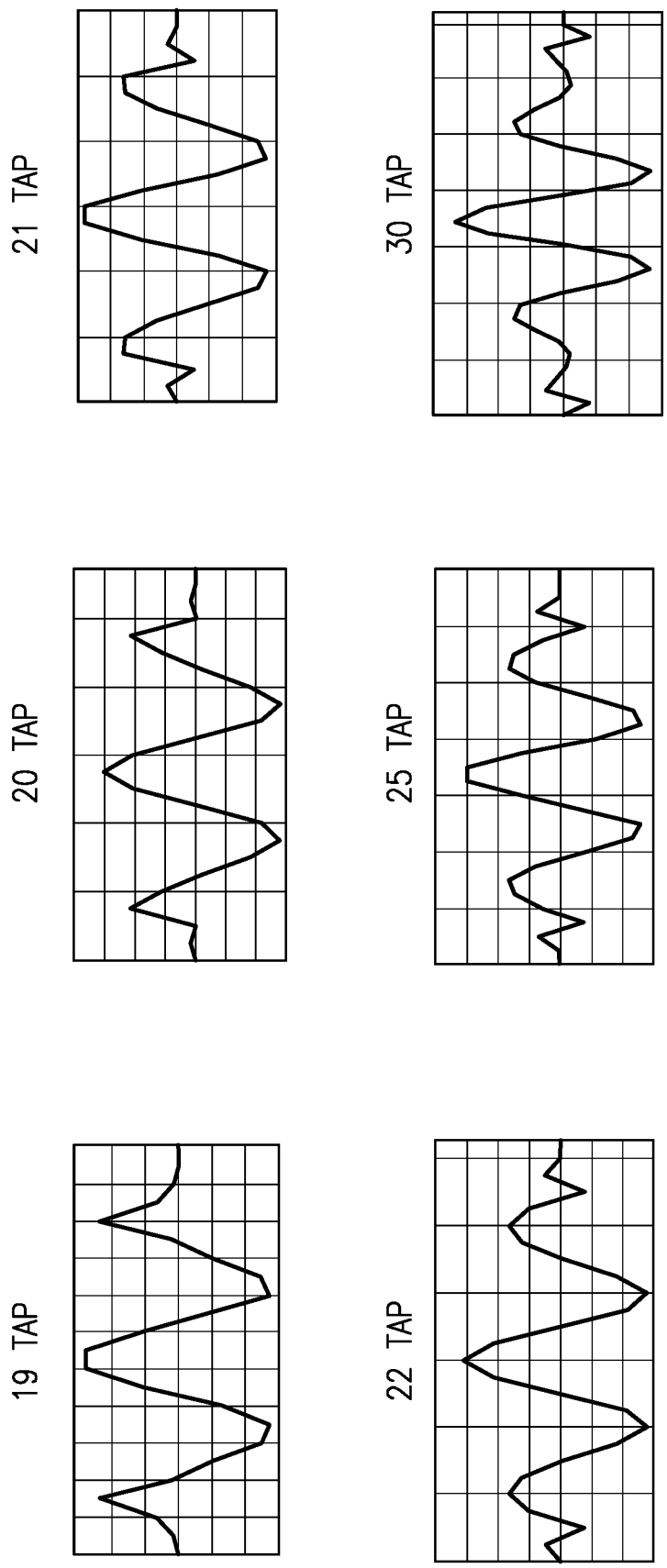
FIG. 2B is a series of graphs illustrating tap coefficient values in accordance with aspects described herein.

In one example, the tap coefficient source 116 includes a coefficient rotation table including tap coefficients for different filter types (e.g., high-pass, low-pass, band-pass, etc.). In some examples, the coefficient rotation table can include tap coefficients for different tap quantities (e.g., 19, 20, 21, etc.). For example, FIG. 2B illustrates examples of tap coefficients corresponding to different tap quantities that can be stored in the coefficient rotation table. In some examples, the tap coefficients can be repeated (i.e., rotated) to generate the tap coefficient signal provided by the tap coefficient source 116. As described above, the amplitude and frequency of the tap coefficient signal may dictate characteristics of the FIR filter 100. In addition, the tap coefficient resolution (i.e., tap quantity) may dictate the roll off and rejection of the FIR filter 100.

Figure 2C:
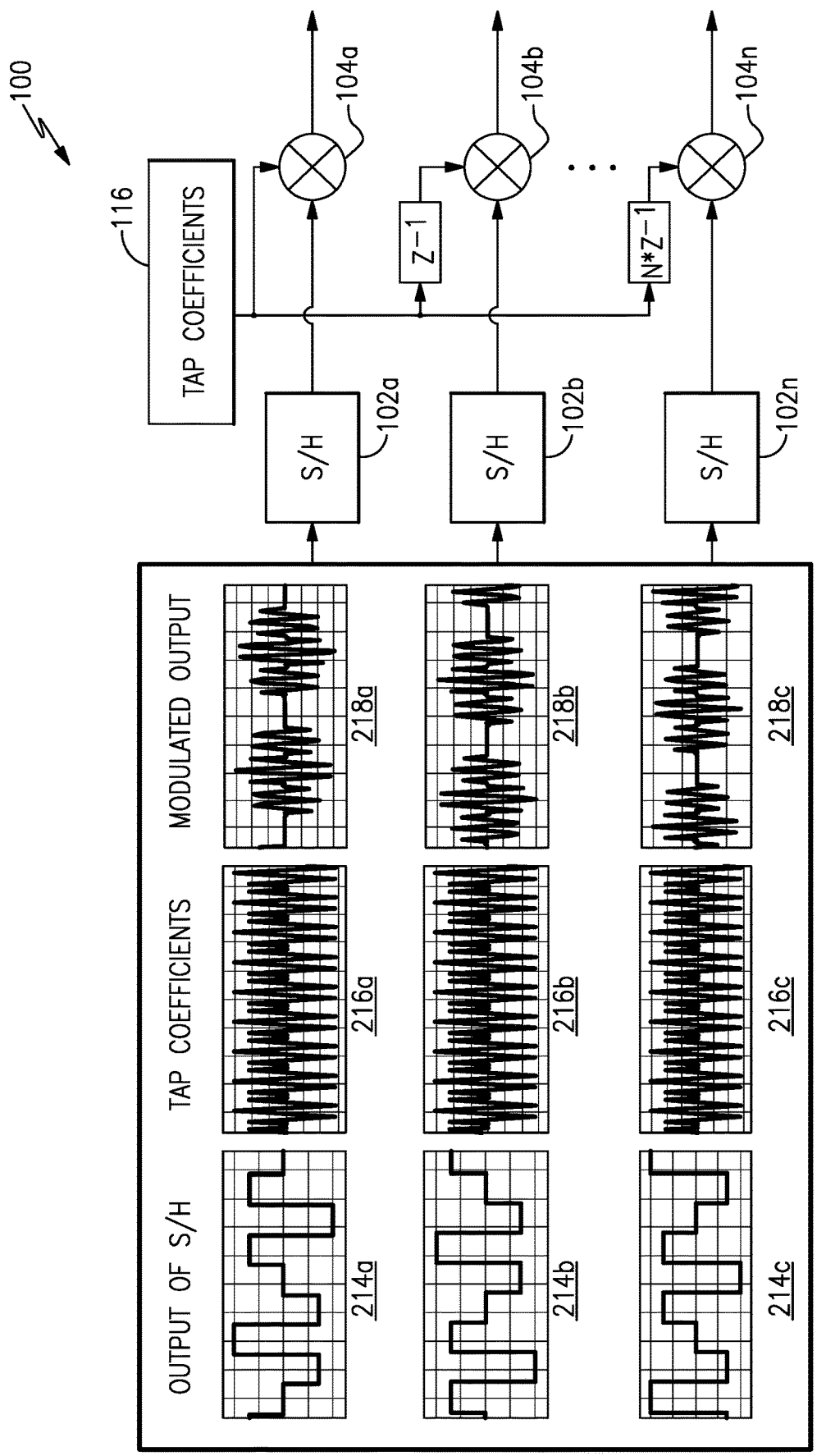
FIG. 2C is a diagram illustrating operation of the FIR filter of FIG. 1 in accordance with aspects described herein.

As shown in FIG. 2C, the tap coefficient signals may be provided to the plurality of multipliers 104 with various delays. In one example, the tap coefficient signals can be provided with the same delays as the clock signals (212a, 212b, etc.). For example, a first tap coefficient signal 216a may be provided to the first multiplier 104a. Likewise, a second tap coefficient signal 216b received by the second multiplier 104b may correspond to the first tap coefficient signal 216a delayed by a first amount (e.g., $z^{-1}$), a third tap coefficient signal 216c received by a third multiplier 214c may correspond to the first tap coefficient signal 216a delayed by a second amount (e.g., $2*z^{-1}$), and so on.

In one example, the plurality of multipliers 104 are configured to multiply the outputs of the sample-and-hold circuits (or taps) with the tap coefficient signals to produce n modulated output signals. For example, the first multiplier 104a is configured to multiply the output of the first sample-and-hold circuit 102a with the first tap coefficient signal 216a to produce the first modulated output signal 218a, the second multiplier 104b is configured to multiply the output of the second sample-and-hold circuit 102b with the second tap coefficient signal 216b to produce the second modulated output signal 218b, and so on.

Figure 2D:
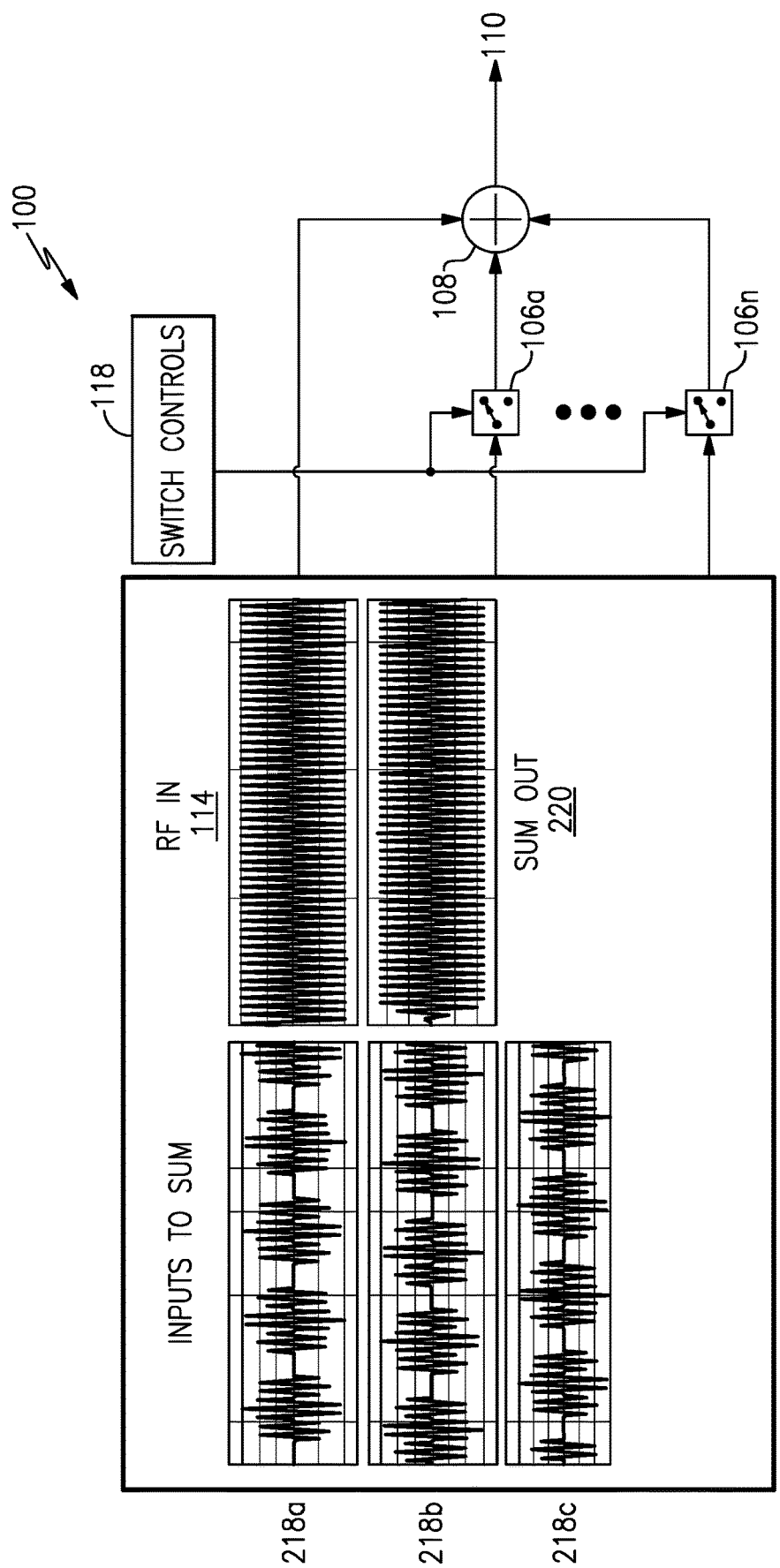
FIG. 2D is a diagram illustrating operation of the FIR filter of FIG. 1 in accordance with aspect described herein.

As described above, each output of the plurality of multipliers 104 is connected to the adder 108. The adder 108 is configured to combine the outputs of the plurality of multipliers 104 to produce a filtered output signal. For example, as shown in FIG. 2D, the adder 108 is configured to combine the n modulated output signals (i.e., 218a, 218b, etc.) to produce the filtered output signal 220. As shown, the filtered output signal 220 may be delayed relative to the input signal 114. In some examples, the filtered output signal 220 is delayed by an amount corresponding to the number of parallel signal paths (i.e., n) in the FIR filter 100. In one example, the filtered output signal 220 is delayed by an amount corresponding to $n*(¼*f_{CLK})$ where $f_{CLK}$ is the frequency of the clock signal provided to the plurality of sample-and-hold circuits 102 (e.g., clock signal 112).

As shown in FIG. 2D, the plurality of switches 106 can be operated to connect and disconnect individual paths from the adder 108. In some examples, the plurality of switches 106 can be operated relative to the configuration of the FIR filter 100. In one example, if the FIR filter 100 is configured as a n-tap filter, then the plurality of switches 106 can be operated such that n parallel paths (e.g., the first path and n-1 switchable paths) are connected to the adder 108. For example, if the FIR filter 100 is configured as a 19-tap filter, the plurality of switches 106 can be operated such that nineteen paths are connected to the adder 108 and any remaining paths are disconnected from the adder 108. In some examples, the plurality of switches 106 may be connected to the switch control source 118 to receive control signals.

In some examples, the plurality of switches 106 can be operated to provide a programmable delay. As described above, the filtered output signal 220 is delayed by an amount corresponding to the number of parallel signal paths (i.e., n) in the FIR filter 100. As such, the plurality of switches 106 can be operated to adjust the output delay of the FIR filter 100. In one example, each parallel path provides a path delay and the plurality of switches 106 are operated to adjust the total delay of the FIR filter 100. For example, when configured as a 19-tap filter, the plurality of switches 106 are operated to connect nineteen parallel paths to the adder 108 and the FIR filter 100 provides a first total delay. When configured as a 20-tap filter, the plurality of switches 106 are operated to connect twenty parallel paths to the adder 108 and the FIR filter 100 provides a second total delay greater than the first total delay. Likewise, when configured as an 18-tap filter, the plurality of switches 106 are operated to connect eighteen parallel paths to the adder 108 and the FIR filter 100 provides a third total delay less than the first total delay.

In some examples, the duty cycle of the clock signal 112 can be scaled with the number of connected parallel signal paths. For example, the duty cycle of the clock signal 112 may be reduced when the number of connected parallel signal paths is increased and reduced when the number of parallel signal paths is decreased.

In various embodiments, the FIR filter 100 may be operated by one or more controllers. In one example, the controller(s) may be included in the FIR filter 100; however, in other examples, the controller(s) may be external to the FIR filter 100. The controller(s) may include one or more general computing processors, specialized processors, or microcontrollers. The controller(s) may include specially-programmed, special-purpose hardware, for example, an application-specific integrated circuit (ASIC), or more generally designed hardware, such as a field programmable gate array (FPGA) or a general purpose processor. In some embodiments, the controller(s) may be connected to one or more memory devices, such as a disk drive, memory, flash memory, embedded or on-chip memory, or other device for storing data.

In one example, the controller(s) can include the tap coefficient source 116 and/or the switch control source 118. In some examples, the controller(s) can include one or more digital-to-analog converters (DAC) configured to convert digital tap coefficient values into the analog variants provided to the plurality of multipliers 104. Likewise, the one or more DACs may be utilized to provide analog switch controls to the plurality of switches 106. In other examples, the tap coefficient source 116 and the switch control source 118 may be included in separate controllers.

As described above, the FIR filter 100 can provide a synthesized frequency response having a programmable delay. Such features may be advantageous for use in various signal conditioning applications including high-frequency and high-power systems (e.g., radar transceivers). In some examples, the components of the FIR filter 100 can include semiconductor devices configured to provide high linearity performance for high frequency, high powered signals.

In one example, the components (i.e., S/H circuits, multipliers, etc.) of the FIR filter 100 can include one or more GaN devices. For example, the FIR filter 100 can include one or more Gallium Nitride (GaN) High-Electron-Mobility Transistors (HEMT). In some examples, the one or more GaN HEMTs may be depletion-mode HEMTs. As known to those skilled in the art, GaN HEMTs can provide large breakdown voltages while operating with high linearity at high frequencies (e.g., above 1 GHz).

Figure 3A:
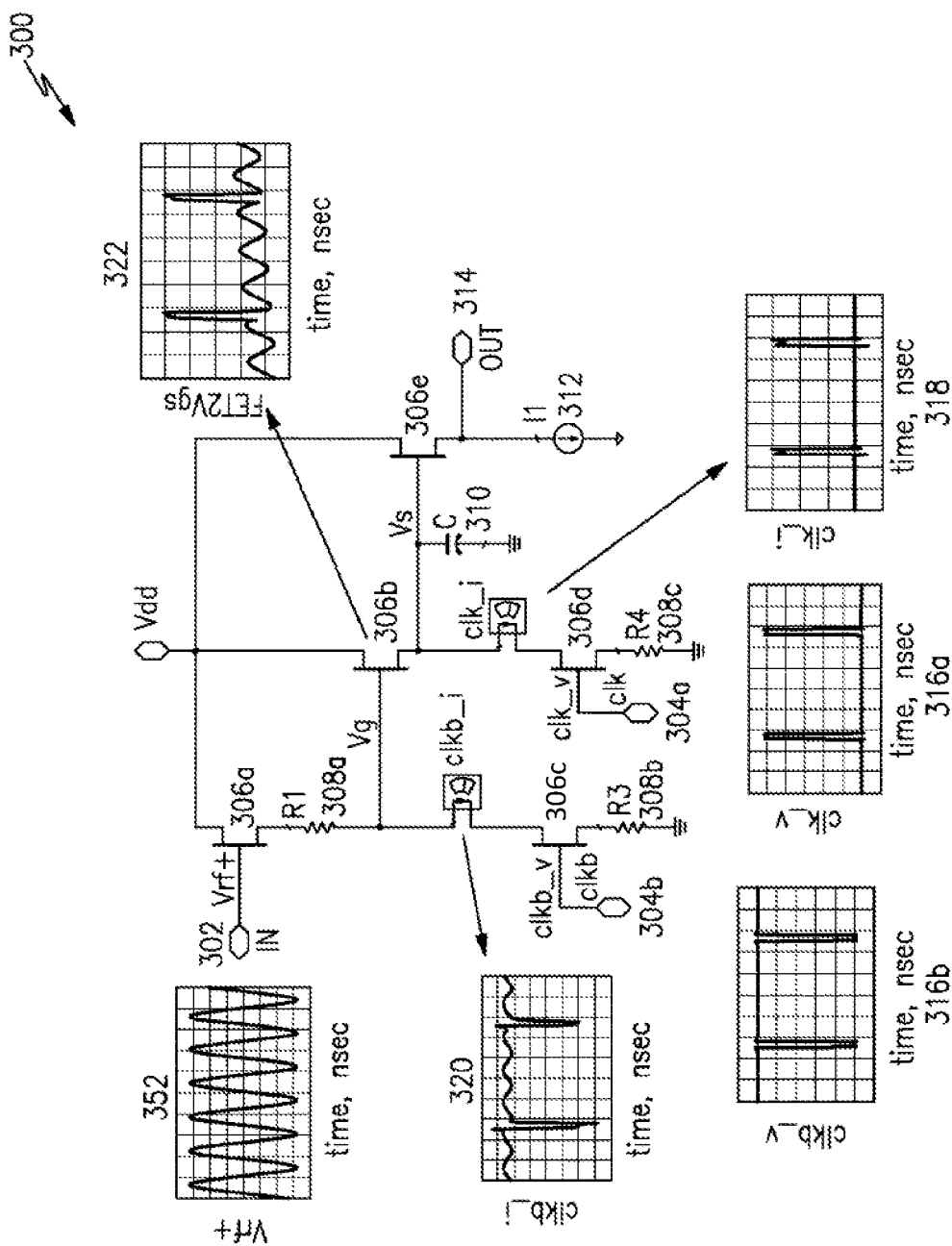
FIG. 3A is a schematic of a sample-and-hold circuit in accordance with aspects described herein.

FIG. 3A illustrates a schematic diagram of a sample-and-hold circuit 300 in accordance with aspects described herein. In one example, the sample-and-hold circuit 300 corresponds to the plurality of sample-and-hold circuits 102 of the FIR filter 100. In some examples, the sample-and-hold circuit 300 includes an input 302, a clock input 304, a plurality of GaN HEMTs 306, a plurality of resistors 308, a capacitor 310, a current source 312, and an output 314. In one example, the plurality of GaN HEMTs 306 includes a first GaN HEMT 306a, a second GaN HEMT 306b, a third GaN HEMT 306c, a fourth GaN HEMT 306d, and a fifth GaN HEMT 306e. As shown, the clock input 304 may include a normal clock input 304a and an inverted clock input 304b; however, in other examples, the clock input 304 may be a single clock input.

In some examples, the input 302 is configured to receive an input signal 352 (e.g., input signal 114). Likewise, the clock input 304a is configured to receive a clock signal 316a (e.g., clock signal 112) and the inverted clock input 304b is configured to receive an inverted clock signal 316b.

In one example, the first GaN HEMT 306a, the third GaN HEMT 306c, and a first resistor 308a of the plurality of resistors 308 are arranged as a gate-bootstrapping stage. In some examples, the third GaN HEMT 306c is configured to operate as a switched current source. Likewise, the capacitor 310, the second GaN HEMT 306b, and the fourth GaN HEMT 306d are arranged as a track-and-hold stage. In some examples, the second GaN HEMT 306b is configured as a source follower and the fourth GaN HEMT 306d is configured to operate as a switched current source. In addition, the fifth GaN HEMT 306e and the current source 312 are arranged as an output buffer stage.

In some examples, the gate-bootstrapping stage prepares (e.g., conditions) the input signal 352 for the track-and-hold stage. The track-and-hold stage receives the conditioned input signal, and the fourth GaN HEMT 306d is operated such that the signal is tracked and held by the capacitor 310 through the second GaN HEMT 306b. In one example, a tracking period occurs when the clock signal 316a is high (e.g., 5V) and a holding period occurs when the clock signal 316a is low (e.g., 0V).

In some examples, during the tracking period, the fourth GaN HEMT 306d is turned on and a high current can pass through the fourth GaN HEMT 306d to turn on the second GaN HEMT 306b. As such, the voltage across the capacitor 310 tracks the voltage applied to the gate of the second GaN HEMT 306b (i.e., the conditioned input signal). The capacitor 310 is charged up to the voltage level of the input signal 352 or discharged (via the fourth GaN HEMT 306d) down to the voltage level of the input signal 352. The graph 318 illustrates an example of the current drawn through the fourth GaN HEMT 306d corresponding to charging/discharging the capacitor 310. In some examples, by charging the capacitor 310 directly from the power supply (i.e., $V_{dd}$), the input signal 352 can be isolated from any large voltage swings and/or discharge currents associated with charging/discharging the capacitor 310 and tracking errors can be reduced.

Likewise, during the holding period, the clock signal 314a is low and the fourth GaN HEMT 306d is turned off. As a result, the second GaN HEMT 306b is turned off and the capacitor 310 is configured to hold the previous sample (i.e., charge). In some examples, the voltage swing of the input signal 352 may be large enough to incidentally turn on the second GaN HEMT 306b. For example, the input signal 352 may have a voltage level larger than the voltage level across the capacitor 310 and the second GaN HEMT 306b may incidentally turn on, allowing the capacitor 310 to charge during the holding period. To prevent the occurrence of such events, the inverted clock signal 314b is driven high during the holding period to turn on the third GaN HEMT 306c. In one example, the third GaN HEMT 306c is configured to operate as a high current source to pull down the gate voltage of the second GaN HEMT 306b through the first resistor 308a. As shown in the graph 320, the current drawn by the third GaN HEMT 306c is high during holding periods and low during tracking periods. As such, the gate-to-source voltage of the second GaN HEMT 306b is high during tracking periods and driven low during holding periods to keep the second GaN HEMT 306b turned off (as shown in graph 322).

Figure 3B:
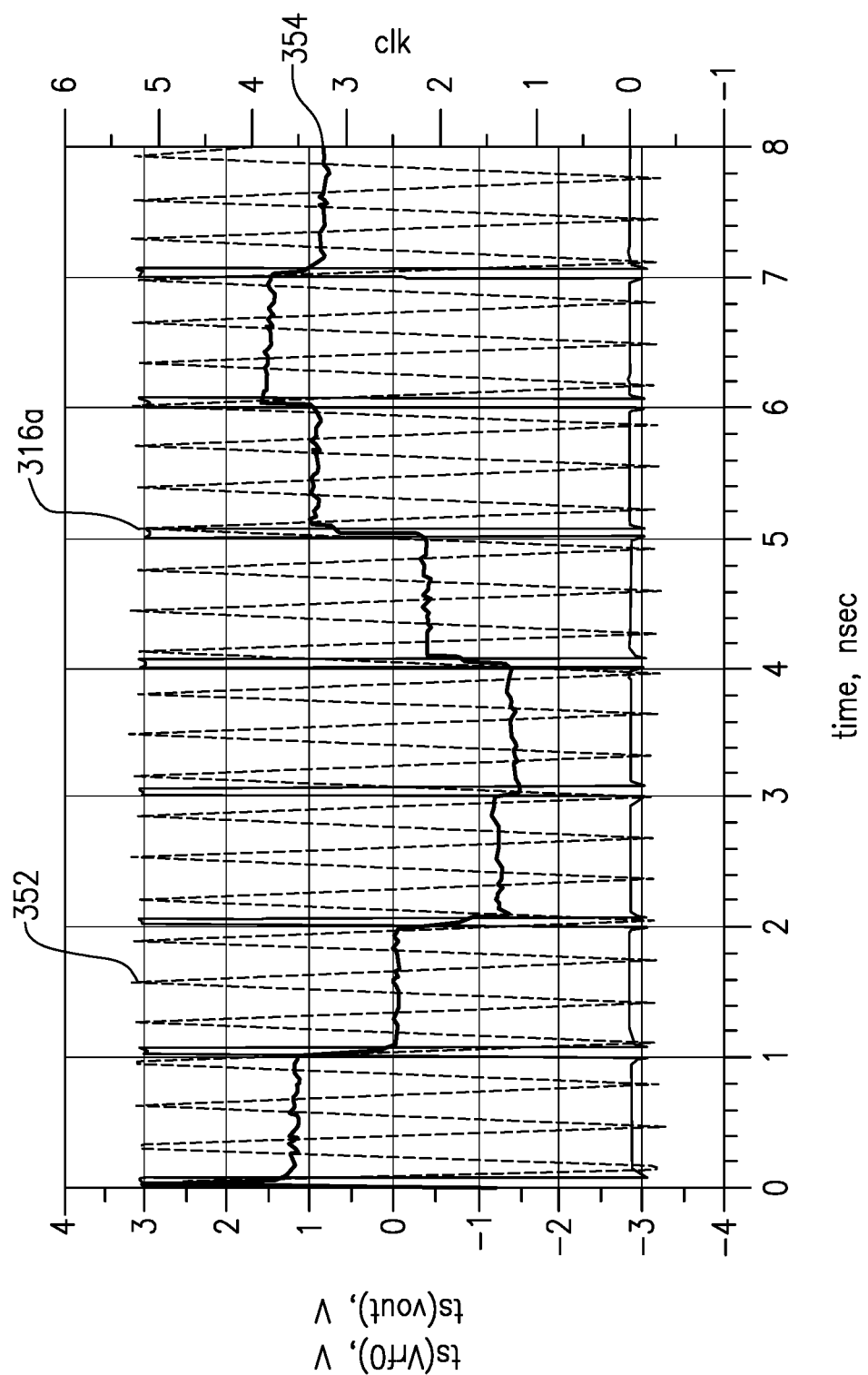
FIG. 3B is a graph of various signals associated with the sample-and-hold circuit of FIG. 3A in accordance with aspects described herein.

FIG. 3B illustrates an output waveform 354 of the sample-and-hold circuit 300 in accordance with aspects described herein. As shown, the sample-and-hold circuit 300 samples the input signal 352 each time the clock 316a goes high (i.e., tracking period) and holds the sampled value while the clock signal 316a is low (i.e., holding period). The sample-and-hold circuit 300 can be transitioned between tracking and holding periods via the clock signal 316a to produce the output signal 354. As described above, the source follower and gate-bootstrapping techniques included in the sample-and-hold circuit 300 can provide accurate tracking and holding of large high-speed voltage signals.

Figure 4:
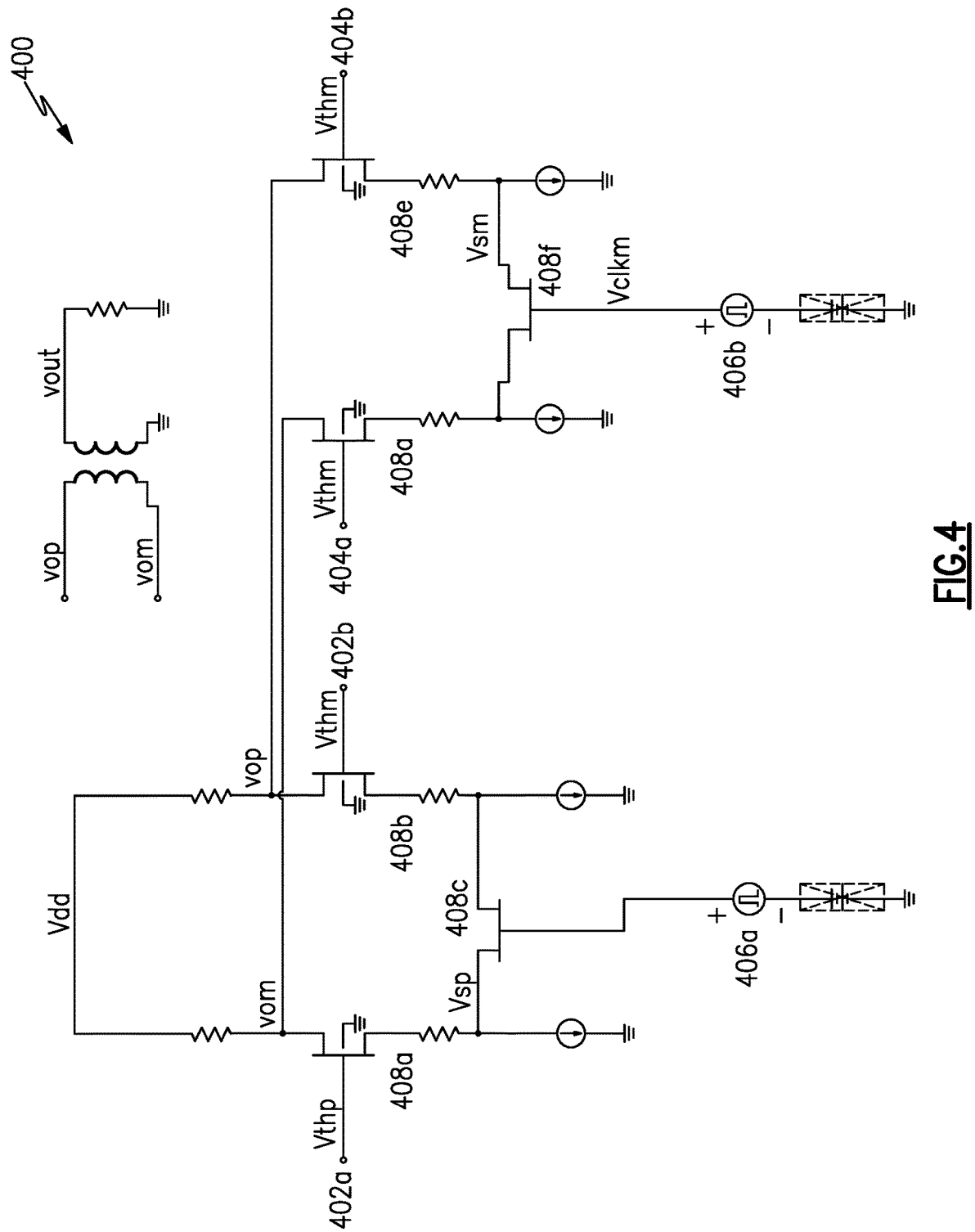
FIG. 4 is a schematic diagram of a multiplier circuit in accordance with aspects described herein.

FIG. 4 illustrates a schematic diagram of a multiplier circuit 400 in accordance with aspects described herein. In one example, the multiplier circuit 400 corresponds to each multiplier of the plurality of multipliers 104 of the FIR filter 100. In some examples, the multiplier circuit 400 includes a first input 402, a second input 404, a clock input 406, and a plurality of GaN HEMTs 408.

As shown, the first input 402 can include a first positive input 402a and a first negative input 402b to receive a differential input signal; however, in other examples, the first input 402 may be a single input configured to receive a single-ended input signal. Similarly, the second input 404 can include a second positive input 404a and a second negative input 404b to receive a differential input signal or a single input to receive a single-ended input signal. In some examples, the clock input 406 may include a normal clock input 406a and an inverted clock input 406b; however, in other examples, the clock input 406 may be a single clock input.

In one example, the plurality of GaN HEMTs 408 includes a first GaN HEMT 408a, a second GaN HEMT 408b, a third GaN HEMT 408c, a fourth GaN HEMT 408d, a fifth GaN HEMT 408e, and a sixth GaN HEMT 408f. In other examples, the multiplier circuit 400 may be configured with a different number of GaN HEMTs.

In some examples, the first input 402 is configured to receive an output signal from a sample-and-hold circuit (e.g., output signal 214a of FIG. 2A) and the second input 404 is configured to receive a tap coefficient signal from a tap coefficient source (e.g., tap coefficient signal 216a of FIG. 2C). Likewise, the clock inputs 406a, 406b may be configured to receive clock signals (e.g., clock signal 212a of FIG. 2A).

As shown, the gate of the third GaN HEMT 408c is modulated by the clock signal received at the normal clock input 406a. Likewise, the gate of the sixth GaN HEMT 408f is modulated by the inverted clock signal received at the inverted clock input 406b. By modulating the third and sixth GaN HEMTs 408c, 408f, the sample-and-hold output signal received at the first input 402 can be multiplied with the tap coefficient signal received at the second input 404 to produce a modulated output signal (e.g., modulated output signal 218a of FIG. 2C). In some examples, the multiplier circuit 400 can include a transformer (e.g., balun) to convert a differential output signal into a single-ended output signal.

Figure 5:
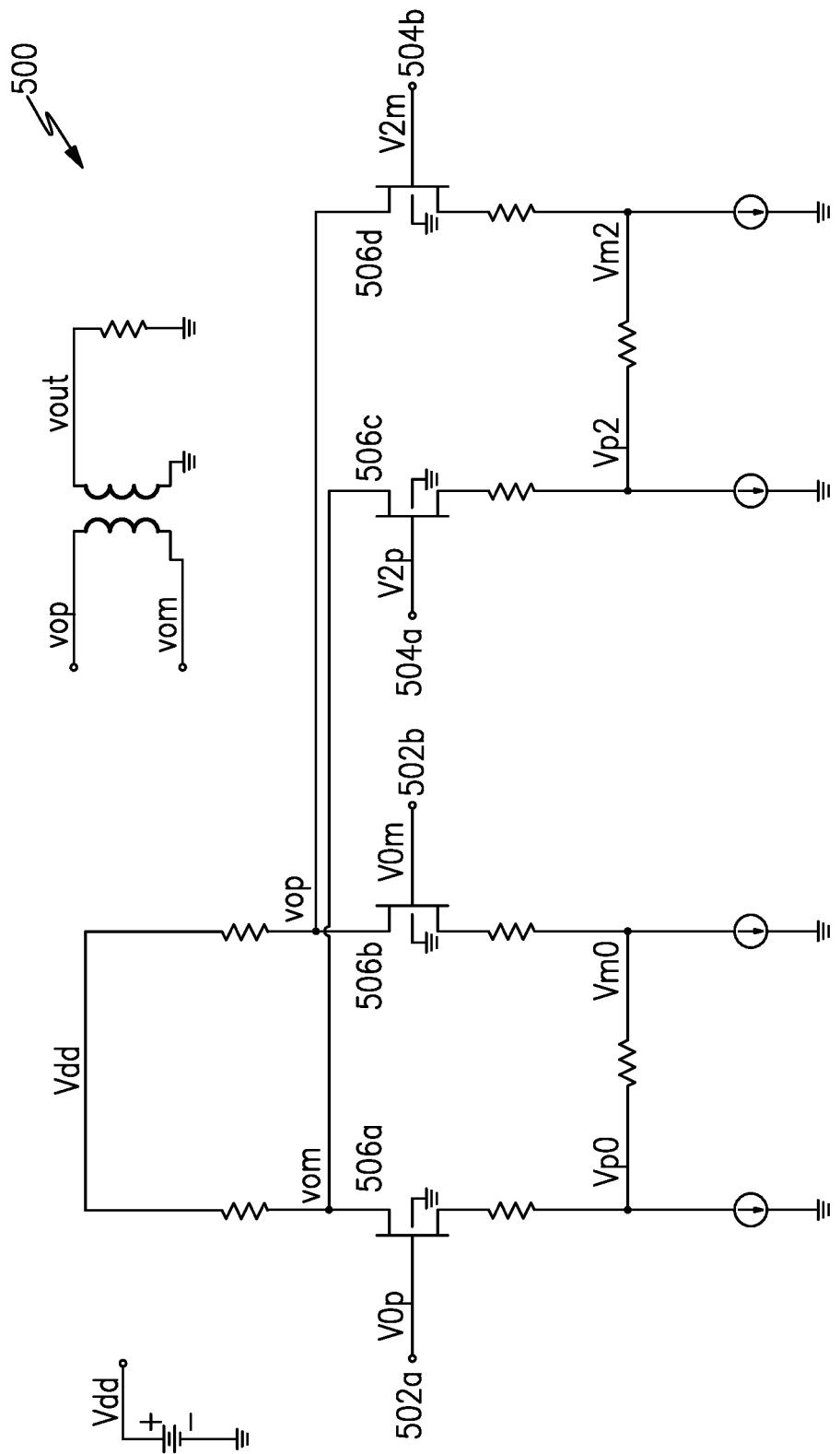
FIG. 5 is a schematic diagram of an adder circuit in accordance with aspects described herein.

FIG. 5 illustrates a schematic diagram of an adder circuit 500 in accordance with aspects described herein. In one example, the adder circuit 500 corresponds to the adder 108 of the FIR filter 100. In the illustrated example, the adder circuit 500 includes a first input 502, a second input 504, and a plurality of GaN HEMTs 506.

In one example, the plurality of GaN HEMTs 506 includes a first GaN HEMT 506a, a second GaN HEMT 506b, a third GaN HEMT 506c, and a fourth GaN HEMT 506d. In other examples, the adder circuit 500 may be configured with a different number of GaN HEMTs.

As shown, the first input 502 can include a first positive input 502a and a first negative input 502b to receive a differential input signal; however, in other examples, the first input 502 may be a single input configured to receive a single-ended input signal. Similarly, the second input 504 can include a second positive input 504a and a second negative input 504b to receive a differential input signal or a single input to receive a single-ended input signal. In some examples, the first input 502 is configured to receive a first modulated output signal from a first multiplier circuit (e.g., modulated output signal 218a of FIG. 2C) and the second input 504 is configured to receive a second modulated output signal from a second multiplier circuit (e.g., modulated output signal 218b of FIG. 2C).

It should be appreciated that the number of inputs and GaN HEMTs of the adder circuit 500 can be scaled according to the total number of parallel signal paths in the FIR filter 100. For example, if the FIR filter 100 is configured with twenty switchable parallel signal paths, then the adder circuit 500 can be configured with twenty inputs to receive a maximum of twenty modulated output signals.

In one example, by providing the modulated output signals to the gates of the plurality of GaN HEMTs 506, the modulated output signals can be combined to produce a filtered output signal (e.g., filtered output signal 220 of FIG. 2D). As described above, the filtered output signal may have a delay corresponding to the number of parallel signal paths connected to the adder circuit 500. In some examples, the adder circuit 500 can include a transformer (e.g., balun) to convert a differential output signal into a single-ended output signal.

While not shown, the plurality of switches 106 of the FIR filter 100 may also include one or more GaN devices. For example, each switch may include a plurality of GaN HEMTs coupled in series. In some examples, the number of GaN HEMTs coupled in series determines the maximum power rating of the switch. In one example, a control signal can be provided from the switch control source 118 to the gate of each GaN HEMT to turn the switch on and off. In some examples, each switch may include a shunt stack of GaN HEMTs connected to the series coupled GaN HEMTs to improve isolation when the switch is turned off. In other examples, each switch may include a plurality of GaN HEMTs arranged in a pole-throw arrangement.

In one example, the same supply voltage (e.g., $V_{dd}$) can be provided to each of the GaN-based components described above. In some examples, each component may receive a large supply voltage (e.g., 18V) to support large input voltage swings corresponding to the various input signals. In other examples, the supply voltage can be adjusted based on the input signal. For example, the supply voltage can be scaled to the maximum voltage swing of the input signal. In one example, a voltage detector and/or controller may be used to track the voltage swing of the input signal and adjust the supply voltage accordingly. In some examples, reducing the supply voltage can reduce the power consumption of the GaN-based components. In addition, operating with the reduced supply voltage can improve the spurious performance (i.e., SFDR) of the GaN-based components. In other examples, each GaN-based component may receive a different supply voltage, and the supply voltages can be adjusted/scaled accordingly.

In one example, the GaN-based components described above can be operated using CMOS devices/controls. In some examples, CMOS devices can be used to provide control voltages to the GaN HEMTs of the various components. For example, CMOS devices may be utilized to provide the dynamic switching controls of the sample-and-hold circuit 300.

Figure 6A:
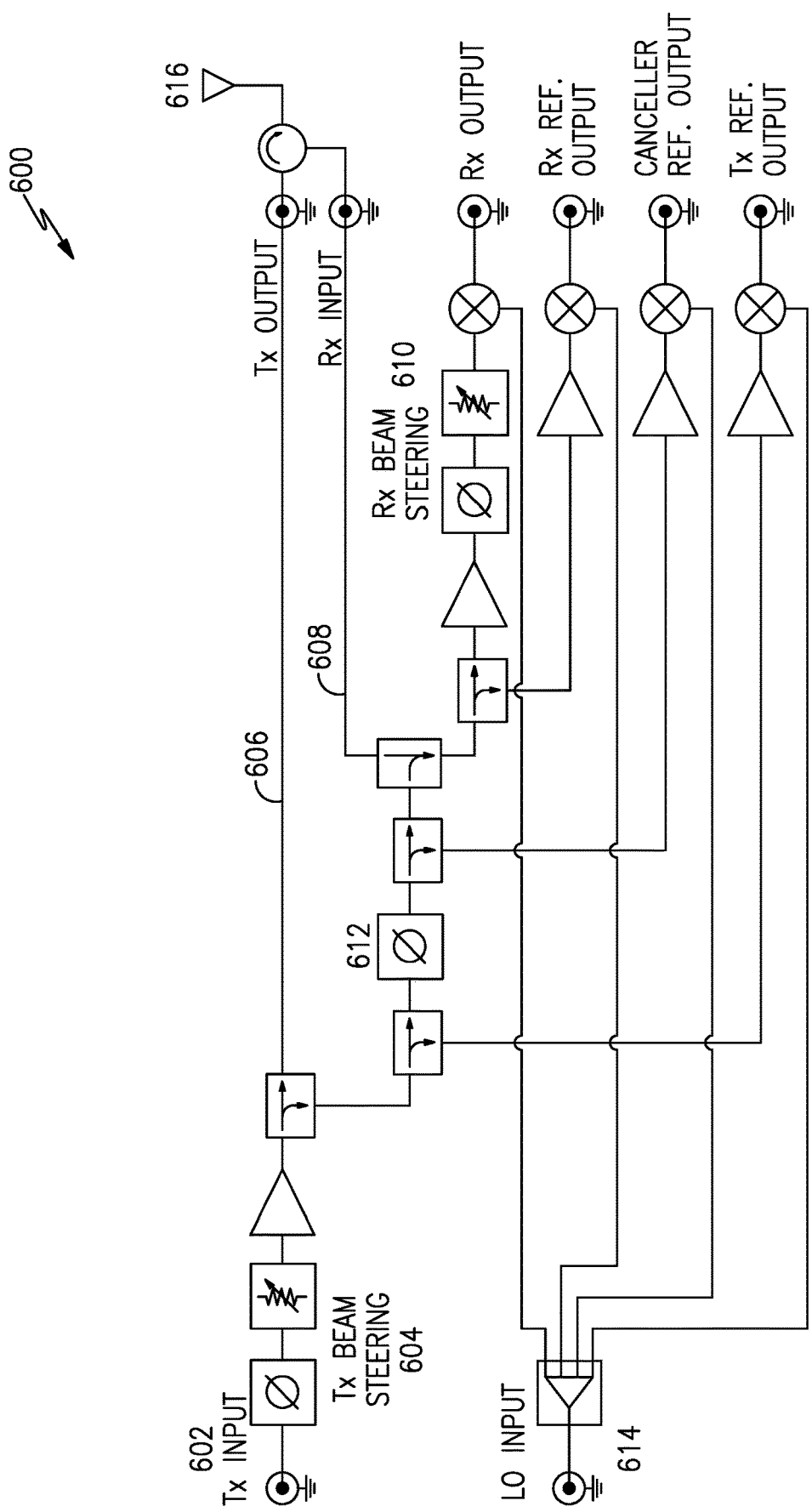
FIG. 6A is a functional block diagram of a transceiver system in accordance with aspects described herein.

FIG. 6A illustrates a functional block diagram of a transceiver system 600 in accordance with aspects described herein. In some examples, the transceiver system 600 can be included in a high-frequency, high-power radar system. In one example, the transceiver system 600 includes a transmit (TX) input 602, a TX beam steering module 604, a TX path 606, a receive (RX) path 608, an RX beam steering module 610, an analog cancelation module 612, a local oscillator (LO) input 614, and an antenna 616.

In one example, the TX input 602 is configured to receive a transmit signal from a transmit signal source. In some examples, the transmit signal is a radio-frequency signal having a high frequency (e.g., 2-4 GHz) and a high power level (e.g., up to 20 dBm). As shown, the transmit signal is provided to the TX beam steering module 604 prior to being transmitted. The beam steering module 604 can include filters, phase shifters, attenuators, and amplifiers configured to produce a conditioned transmit signal. The conditioned transmit signal can be provided to the antenna 616 via the TX path 606 to be transmitted.

Likewise, the antenna 616 is configured to receive a receive signal. In one example, the power level of the receive signal is much lower than the power level of the transmit signal. In some examples, the receive signal may have substantially the same frequency as the transmit signal (e.g., 2-4 GHz); however, in other examples, the receive signal may have a higher or lower frequency. As shown, the receive signal is provided to the RX beam steering module 610 via the RX path 608. The RX beam steering module 610 can include filters, phase shifters, attenuators, and amplifiers configured to produce a conditioned receive signal. The conditioned receive signal can be provided to an RX output for further processing (e.g., beamforming). In some examples, prior to being provided to the RX output, the conditioned receive signal can be down converted to a lower frequency by a mixer stage using an LO signal received at the LO input 614.

In some examples, the high power transmit signals may interfere with the low power receive signals. For example, the TX and RX paths 606, 608 may be located in close proximity, allowing transmit signals to couple to the RX path 608. In addition, being that the antenna 616 is configured to transmit and receive signals, transmit signals may leak (e.g., via a directional coupler) into the RX path 608. In some examples, interference can emanate from signals transmitted by other transceivers (e.g., different systems, different transmit elements, etc.)

As such, the analog cancellation module 612 is configured to mitigate (or cancel) transmit signal interference in the RX path 608. In some examples, the analog cancellation module 612 includes the FIR filter 100 of FIG. 1. As described above, the FIR filter 100 can include GaN-based components to provide a synthesized frequency response with programmable delays for use with high-frequency and high-power signals.

Figure 6B:
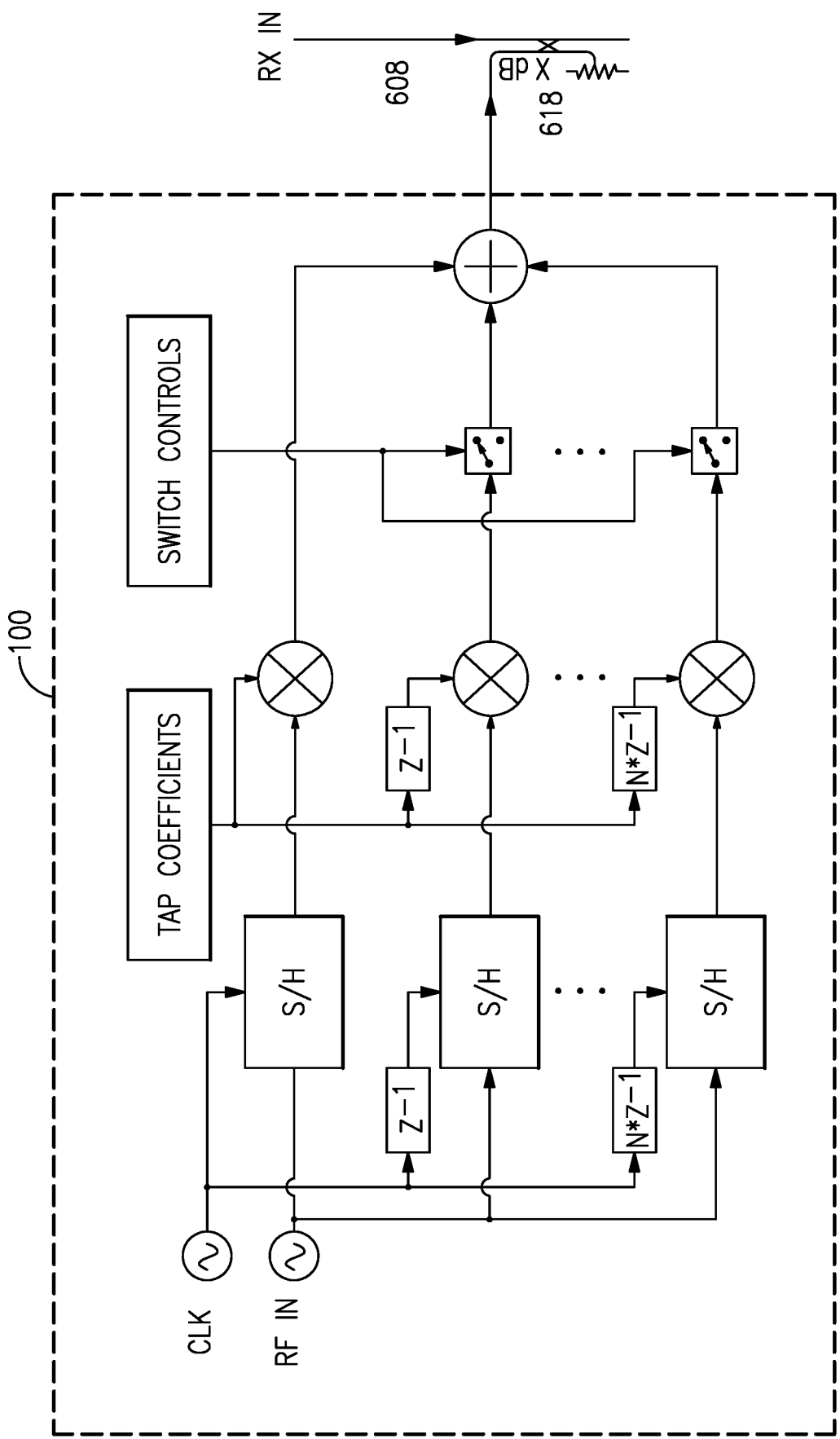
FIG. 6B is a functional block diagram of a FIR filter integrated in the transceiver system of FIG. 6A in accordance with aspects described herein.

In one example, a copy of the conditioned transmit signal is provided to the analog cancelation module 612 (i.e., the FIR filter 100). As shown, a coupler can be positioned in the transmit path 606 to sample the conditioned transmit signal and provide a copy of the signal to the FIR filter 100. In some examples, the FIR filter 100 can provide a synthesized frequency response corresponding to the frequency response of the RX path 608 (i.e., front-end receiver of the transceiver system 600). For example, the FIR filter 100 may be configured to use tap coefficients corresponding to an inverse frequency response of the RX path 608. In some examples, the FIR filter 100 may produce a cancellation signal corresponding to the inverse of the transmit signal interference in the RX path 608. As such, the cancellation signal can be injected into the RX path 608 to mitigate (or cancel) the transmit signal interference. As shown in FIG. 6B, the output of the FIR filter 100 (i.e., output of the adder 108) can be connected to a coupler 618 configured to provide cancellation signal to the RX path 608.

Figure 6C:
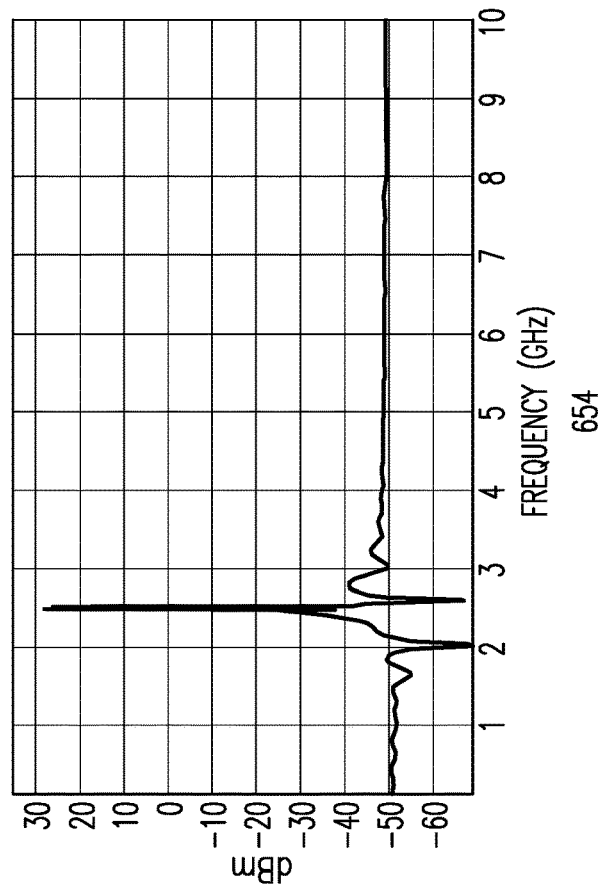
FIG. 6C is a series of graphs illustrating various signals associated with the transceiver system of FIG. 6A in accordance with aspects described herein.
Figure 6C:
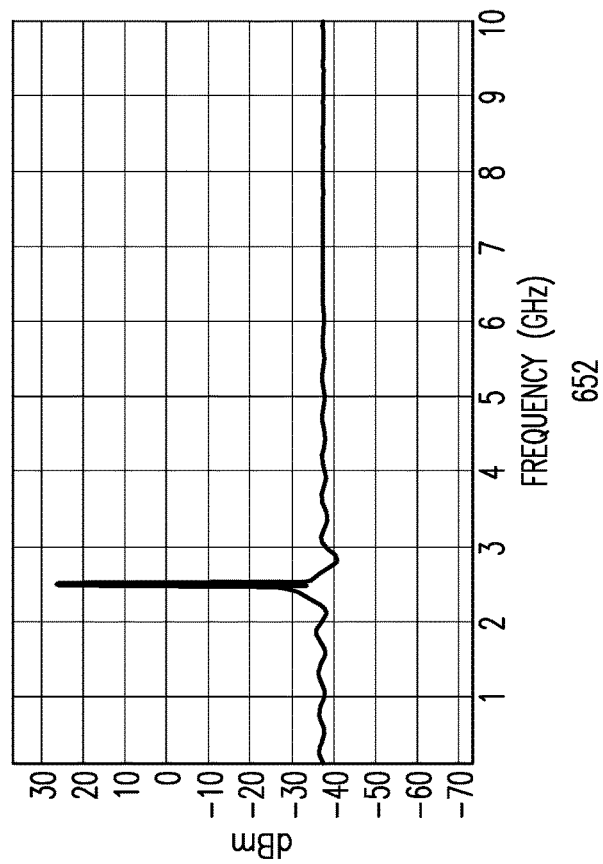

In other examples, the FIR filter 100 may be configured to use tap coefficients corresponding to the normal frequency response of the RX path 608. As such, the cancellation signal may correspond to the actual transmit signal interference in the RX path 608. For example, FIG. 6C illustrates a frequency domain representation of a transmit interference signal 652 in the RX path 608 and a frequency domain representation of a cancellation signal 654 produced by the FIR filter 100. In some examples, an inverter circuit (e.g., multiplier) can be included at the output of the FIR filter 100 to invert the cancellation signal, allowing the cancellation signal 654 to cancel the transmit signal interference in the RX path 608.

In one example, being that the FIR filter 100 includes the GaN-based components described herein, the analog cancelation module 612 can operate at the actual power levels of the transmit signals (e.g., up to 20 dBm). In addition, the GaN-based components can provide high-linearity performance at the power levels and frequencies of the transmit signals, improving cancellation accuracy.

As described above, the FIR filter 100 can provide programmable delays by operating the plurality of switches 106 and adjusting the tap coefficient resolution (i.e., changing the value of n). In some examples, calibrating the delay provided by the FIR filter 100 can further improve the cancellation of transmit signal interference.

Figure 6D:
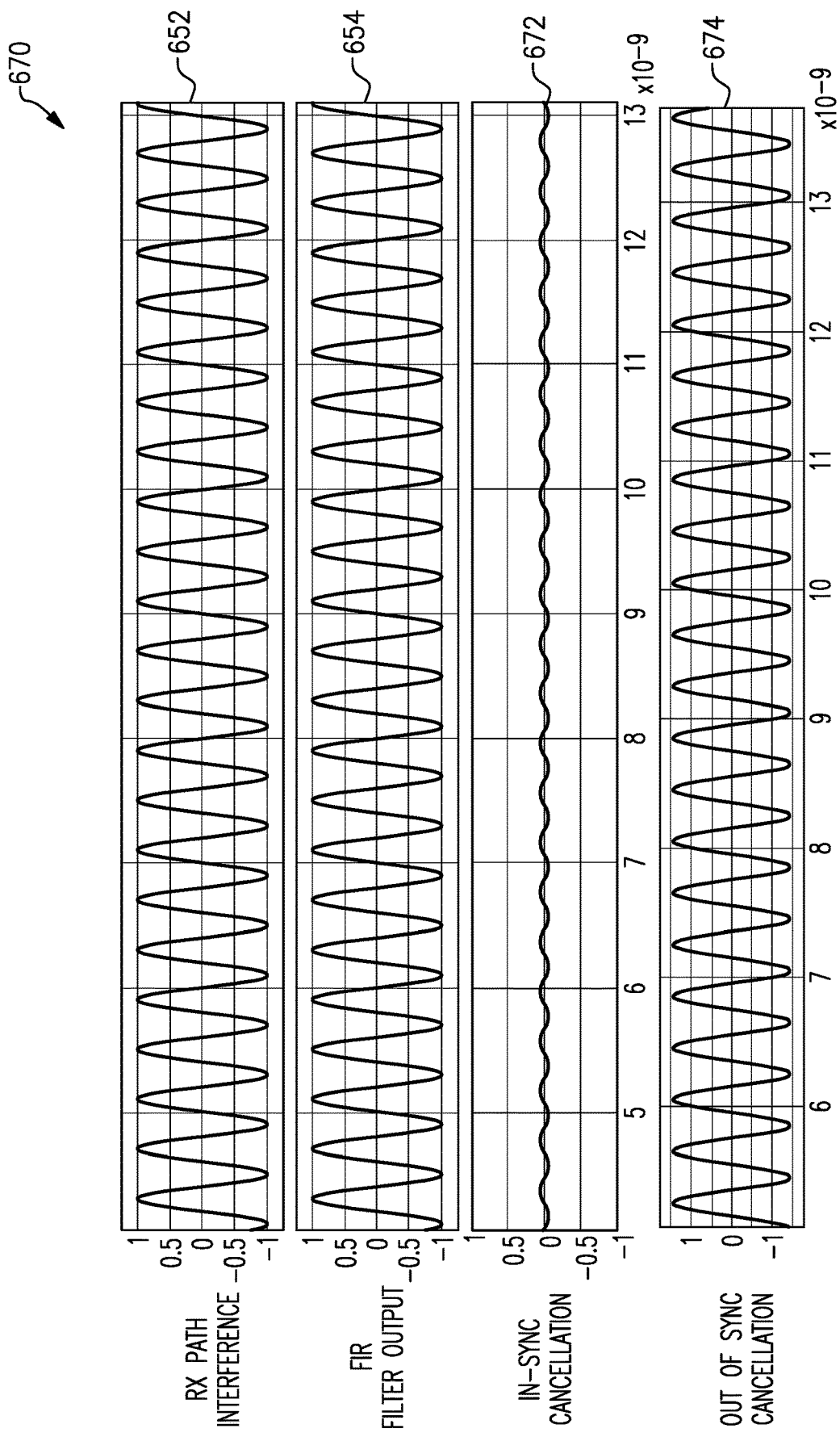
FIG. 6D is a series of graphs illustrating various signals associated with the transceiver system of FIG. 6A in accordance with aspects described herein.

FIG. 6D is a graph 670 illustrating various waveforms of the transceiver system 600. As shown, the graph 670 includes time domain representations of the transmit interference signal 652 in the RX path 608 and the cancellation signal 654 of the FIR filter 100. In one example, a first waveform 672 corresponds to an in-sync cancelation of the transmit interference signal 652. Likewise, a second waveform 674 corresponds to an out-of-sync cancellation of the transmit interference 652.

In one example, in-sync cancellation can be achieved when the transmit interference signal 652 and the cancellation signal 654 have a signal correlation resolution below a correlation threshold (e.g., 1 picosecond). In some examples, the delay of the FIR filter 100 can be adjusted until the signal correlation resolution between the signals is below the correlation threshold. For example, the number of parallel signal paths connected to the adder 108 (i.e., n) and the n-tap coefficients provided to the plurality of multipliers 104 can be adjusted to provide an acceptable signal correlation resolution.

In certain examples, out-of-sync cancellation can occur when the bandwidth of the FIR filter 100 is larger than the passband of the RX path 608, allowing out-of-band signals into the RX path 608. As such, different tap coefficients can be selected/rotated until an acceptable bandwidth of the FIR filter 100 is achieved. In some examples, increasing the rotation frequency of the tap coefficients can also improve interference cancellation.

It should be appreciated that embodiments described herein are not limited to the cancellation of specific types of transmit signal interference. While the cancellation of single frequency transmit signals is described above, in other examples, the analog cancelation module 612 (i.e., the FIR filter 100) can provide cancellation signals configured to cancel interference associated with multi-frequency transmit signals (e.g., chirps).

Accordingly, various aspects and examples described herein provide an improved analog FIR filter implementation. In at least one embodiment, the FIR filter structure includes Gallium Nitride (GaN) components configured to provide high linearity operation for high powered signals. In some examples, the FIR filter can be configured to synthesize the frequency response of a front-end receiver to mitigate co-site transmit interference in a radar transceiver system.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A finite impulse response (FIR) filter comprising:
an input of the FIR filter that receives an RF input signal;
a clock input configured to receive a clock signal;
an output of the FIR filter that provides a filtered output signal;
a plurality of signal paths including a plurality of sample-and-hold circuits and the plurality of multipliers arranged in parallel, each signal path including a respective sample-and-hold circuit and a respective multiplier being configured to receive the RF input signal and the clock signal to provide a modulated output signal, each respective signal path of the plurality of signal paths receiving the clock signal according to a respective clock signal delay, each clock signal delay different from each other clock signal delay, and each multiplier of each signal path receiving a respective tap coefficient signal having a respective tap coefficient delay corresponding to the respective signal path;
an adder configured to receive n modulated output signals from the plurality of signal paths and combine the n modulated output signals to produce the filtered output signal; and
a controller.

2. The FIR filter of claim 1, further comprising a plurality of switches, each switch of the plurality of switches being coupled to the controller and configured to selectively connect and disconnect at least one signal path of the plurality of signal paths.

3. The FIR filter of claim 2, wherein the controller and the plurality of switches are configured to be controllable and to be operated to adjust a value of n.

4. The FIR filter of claim 3, wherein each signal path of the plurality of signal paths includes a path delay, and a total delay of the filtered output signal relative to the RF input signal is controlled by adjusting the value of n.

5. The FIR filter of claim 1, wherein the plurality of sample-and-hold circuits are further configured to sample the RF input signal based on the respective clock signal delays of the signal paths to provide a plurality of sampled output signals.

6. The FIR filter of claim 5, wherein the plurality of multipliers are configured to multiply the sampled output signals with a respective tap coefficient value of the respective tap coefficient signal to provide a plurality of modulated output signals.

7. The FIR filter of claim 6, wherein the tap coefficient signals correspond to settings for an n-tap filter configuration.

8. The FIR filter of claim 6, wherein each tap coefficient signal includes at least one rotating tap coefficient value.

9. The FIR filter of claim 1, wherein the plurality of sample-and-hold circuits and the plurality of multipliers include one or more Gallium Nitride (GaN) devices configured to provide linear operation of the FIR filter.

10. The FIR filter of claim 9, wherein the controller provides a supply voltage to the one or more GaN devices that is adjusted based on a maximum voltage of the RF input signal to optimize at least one of power consumption and spurious performance.

11. The FIR filter of claim 10, wherein the supply voltage is adjusted to a minimum value needed to support a maximum voltage swing of the RF input signal.

12. The FIR filter of claim 9, wherein each sample-and-hold circuit of the plurality of sample-and-hold circuits includes a plurality of GaN HEMTs arranged in a gate-bootstrapping stage and a sample-and-hold stage.

13. The FIR filter of claim 12, wherein the sample-and-hold stage includes a source follower and a switched current source configured to charge and/or discharge a capacitor to track a voltage of the input signal during a tracking period and to hold the capacitor charge during a holding period.

14. The FIR filter of claim 13, wherein the gate-bootstrapping stage is coupled to the source follower of the sample-and-hold stage to prevent large voltage swings of the input signal from allowing the capacitor to be charged and/or discharged during the holding period.

15. An analog cancellation module including a finite impulse response (FIR) filter for use in a transceiver system, the analog cancellation module comprising:
an input of the analog cancellation module that receives an RF input signal, the RF input signal corresponding to a transmit signal provided to a transmit path of the transceiver system;
an output of the analog cancellation module that provides a cancellation signal to a receive path of the transceiver system to cancel transmit signal interference;
the FIR filter including a plurality of signal paths configured to provide a synthesized frequency response corresponding to the receive path and an adder, each signal path including a respective sample-and-hold circuit and a respective multiplier configured to receive the RF input signal and provide a modulated output signal, each signal path of the plurality of signal paths receiving the clock signal according to a respective clock signal delay, each clock signal delay different from each other clock signal delay, and each multiplier of each signal path being configured to receive a respective tap coefficient signal having a respective tap coefficient delay corresponding to the clock signal delay of the signal path, and the adder being configured to receive n modulated output signals from the plurality of signal paths and combine the n modulated output signals to provide the cancellation signal; and a controller.

16. The analog cancellation module of claim 15, wherein each sample-and-hold circuit and multiplier of the FIR filter includes one or more Gallium Nitride (GaN) devices configured to provide linear operation of the FIR filter.

17. The analog cancellation module of claim 15, wherein the FIR filter further includes a plurality of switches coupled to the controller and configured to selectively connect and disconnect at least one signal path of the plurality of signal paths.

18. The analog cancellation module of claim 17, wherein the controller and the plurality of switches of the FIR filter are configured to be controllable and to be operated to adjust a value of n.

19. The analog cancellation module of claim 18, wherein the value of n corresponds to a number of taps of the FIR filter and is adjusted to control a delay of the cancellation signal relative to the transmit signal interference.

20. The analog cancellation module of claim 19, wherein each multiplier is configured to receive rotating tap coefficients of the tap coefficient signals, the rotating tap coefficients corresponding to n-tap filter settings, and to multiply an output signal of each sample-and-hold circuit with the rotating tap coefficients to provide the n modulated output signals.

21. The analog cancellation module of claim 20, wherein the n-tap filter settings correspond to a frequency response of the receive path of the transceiver system.

* * * * *